United States Patent
Baardse et al.

(10) Patent No.: US 10,140,389 B2
(45) Date of Patent: Nov. 27, 2018

(54) MODIFYING CONSTRAINED AND UNCONSTRAINED CURVE NETWORKS

(71) Applicants: Dick Baardse, Geldermalsen (NL); Feng Yu, Irvine, CA (US); Hui Qin, Shanghai (CN); Ying Lin, Yantai (CN); Jinbiao Zhu, Shanghai (CN)

(72) Inventors: Dick Baardse, Geldermalsen (NL); Feng Yu, Irvine, CA (US); Hui Qin, Shanghai (CN); Ying Lin, Yantai (CN); Jinbiao Zhu, Shanghai (CN)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 290 days.

(21) Appl. No.: 14/889,515

(22) PCT Filed: May 28, 2013

(86) PCT No.: PCT/CN2013/076336
§ 371 (c)(1),
(2) Date: Nov. 6, 2015

(87) PCT Pub. No.: WO2014/190491
PCT Pub. Date: Dec. 4, 2014

(65) Prior Publication Data
US 2016/0125099 A1  May 5, 2016

(51) Int. Cl.
*G06F 17/50* (2006.01)

(52) U.S. Cl.
CPC .................................. *G06F 17/50* (2013.01)

(58) Field of Classification Search
None
See application file for complete search history.

(56) References Cited

U.S. PATENT DOCUMENTS

2008/0143708 A1* 6/2008 Owen ..................... G06F 17/50
 345/419
2008/0252663 A1 10/2008 Kripac et al.
(Continued)

FOREIGN PATENT DOCUMENTS

CN  102214254 A  10/2011
CN  102754103 A  10/2012
(Continued)

OTHER PUBLICATIONS

Gunay Orbay et al.; "Sketch-based Surface Design Using Malleable Curve Networks," Computers and Graphics, vol. 36, No. 8, Dec. 1, 2012, GB, XP055344118, 14 pages.
(Continued)

*Primary Examiner* — Syed A Roni

(57) ABSTRACT

Methods for modifying geometric models and corresponding systems and computer-readable mediums. A method includes receiving a geometric model, the geometric model including a plurality of curves. The method includes receiving a selection of one or more curves of the plurality of curves, finding at least one other curve of the plurality of curves that is related to the selected curve, and finding relationships between the selected curve and the other curve(s), including adding the selected curve, the other curve(s), and the relationships to a selected curve set. The method includes pre-processing the selected curve set, including de-activating a set of constraints for the geometric model. The method includes receiving a modification of the selected curve and modifying the selected curve set to produce a modified geometric model and modified selected curve set. The method includes post-processing the modified selected curve set, including re-activating and applying constraints for the geometric model.

17 Claims, 3 Drawing Sheets

(56) References Cited

U.S. PATENT DOCUMENTS

2009/0259442 A1 10/2009 Gandikota et al.
2012/0179430 A1 7/2012 Aish et al.
2013/0120383 A1 5/2013 Joshi et al.

FOREIGN PATENT DOCUMENTS

| CN | 103392180 A | 11/2013 |
| JP | H04348479 A | 12/1992 |
| JP | 2011516999 A | 5/2011 |
| JP | 2011517827 A | 6/2011 |

OTHER PUBLICATIONS

EP Search Report dated Feb. 27, 2017, for EP Application No. 13885627.3, 10 pages.
Foreign Communication From a Related Counterpart Application, PCT Application No. PCT/CN2013/076336, International Search Report and Written Opinion dated Mar. 6, 2014, 11 pages.
Chinese office action dated Jan. 26, 2018, for CN Application No. 201380076950.6, 7 pages.

* cited by examiner

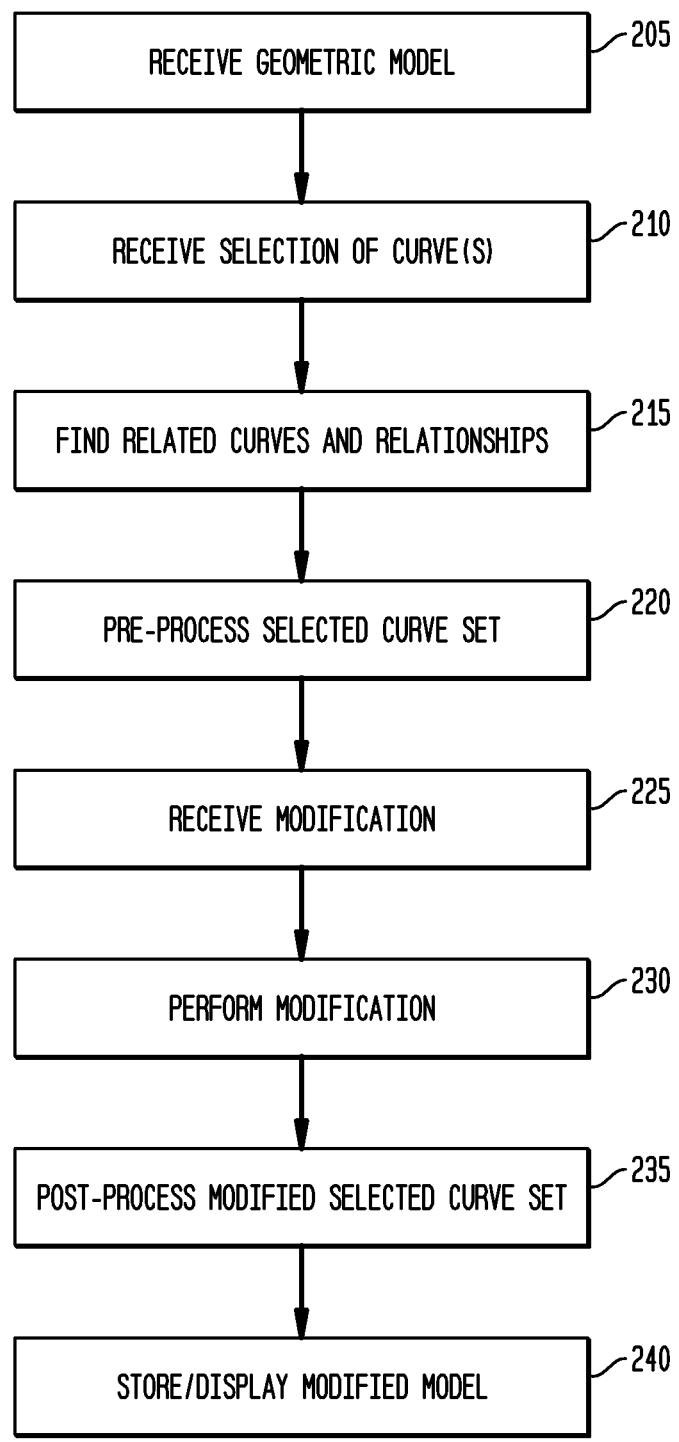

MODIFYING CONSTRAINED AND UNCONSTRAINED CURVE NETWORKS

RELATED APPLICATION

This patent document claims priority under 35 U.S.C. § 119 and all other benefits from PCT Application No. PCT/CN2013/076336, filed May 28, 2013, the content of which is hereby incorporated by reference to the extent permitted by law.

CROSS-REFERENCE TO OTHER APPLICATIONS

This application shares some subject matter with commonly-assigned U.S. patent application Ser. No. 13/873,642, filed Apr. 30, 2013, for "Curves in a Variational System", which is hereby incorporated by reference.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include methods for modifying geometric models and corresponding systems and computer-readable mediums. A method includes receiving a geometric model, the geometric model including a plurality of curves. The method includes receiving a selection of one or more curves of the plurality of curves, finding at least one other curve of the plurality of curves that is related to the selected curve, and finding relationships between the selected curve and the other curve(s), including adding the selected curve, the other curve(s), and the relationships to a selected curve set. The method includes pre-processing the selected curve set, including de-activating a set of constraints for the geometric model. The method includes receiving a modification of the selected curve and modifying the selected curve set to produce a modified geometric model and modified selected curve set. The method includes post-processing the modified selected curve set, including re-activating and applying constraints for the geometric model.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 2 depicts a flowchart of a process in accordance with disclosed embodiments.

DETAILED DESCRIPTION

Figure 1:
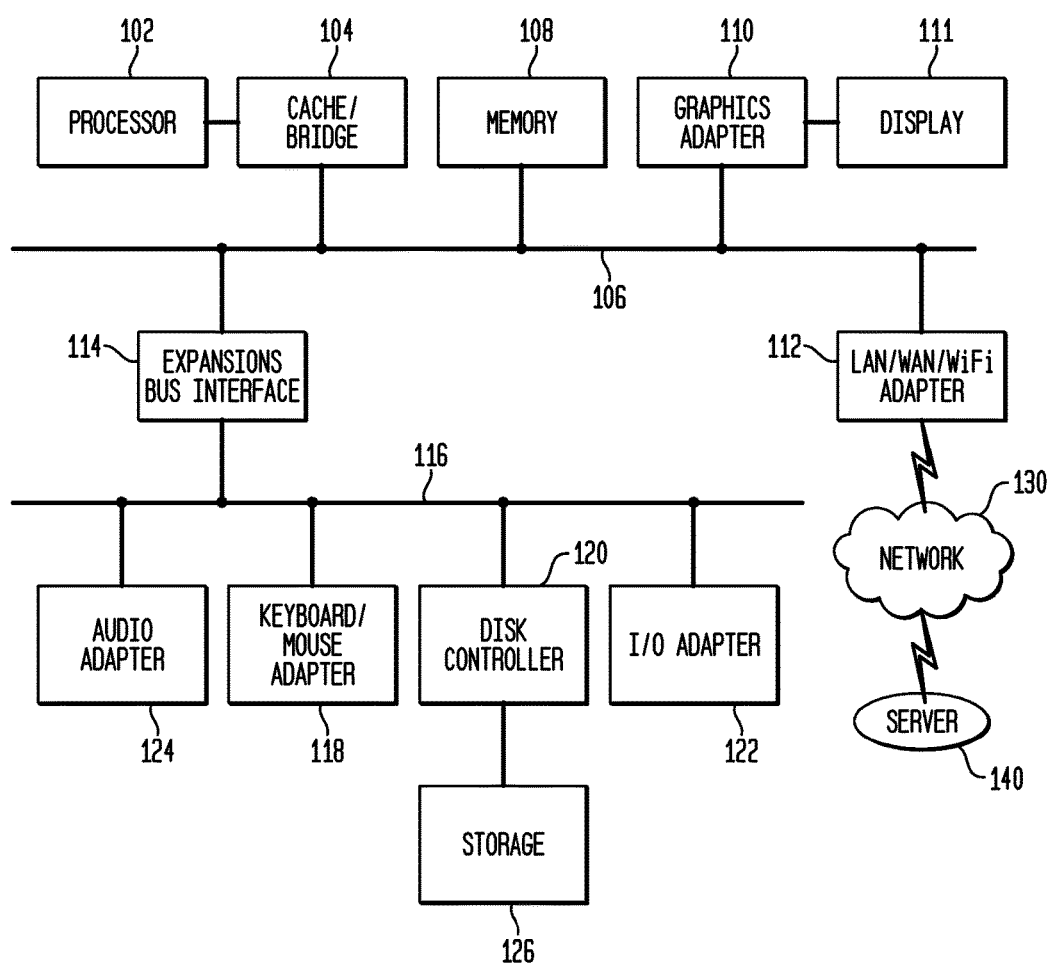
FIG. 1 depicts a block diagram of a data processing system in which an embodiment can be implemented.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Within a variational modeling system, such as the "Synchronous Technology" processes used in Siemens Product Lifecycle Management Software, Inc. products, changes are generally expressed variationally. A variational system describes the parameters of and relationships between features in an object model or set of curves in terms of geometric constraints and dimensions. Such systems then use a "solver" process to process these constraints and dimensions, along with a multitude of ancillary constraints and dimensions required to maintain design intent, and the entire model is solved simultaneously.

Conventionally, curve geometry in either two dimensions (2D) or three dimensions (3D) has been controlled with either no constraints or by having to fully constrain the whole system, either automatically or manually. Neither of these methods has the advantages of synchronous technology, which automates a selection-based, local, fast, and intuitive edit and does not require constraining the whole system.

Synchronous curve editing allows modification of curves after inferring relationships between selected curves, connected curves and neighboring curves before the modification. The relationships that are inferred are enforced on all curves while making the modification. This makes the synchronous curve editing tools more powerful than with traditional tools.

The basic process is that one or more curves are selected for modification. After selection inferring of the relationships is done by a curve finder. The curves are then modified by an operation, such as move or offset. After the operation constraint post processing is performed to decide what to do with any pre-existing (sketch) constraints. The result of the curve modification is a modified set of curves.

Disclosed embodiments include systems and methods to modify constrained and unconstrained curve networks by inferring and solving transient constraints. Note that while specific embodiments are described herein in the context of 2D geometry, the techniques discussed herein apply as well to 3D geometry.

FIG. 1 depicts a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/ Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Various disclosed embodiments enable synchronous editing of curve networks using inferred relationships between curves. Relationships can include such aspects as connections, parallel, tangent, or orthogonal relationships, mirror or opposite relationships, and others. Disclosed embodiments can also use specific operations such as move curve, offset move curve, resize curve, and delete curve.

In some systems, when a user is working on curve modifications in large unconstrained sets of curves, it is difficult to keep design intent. The user might want to keep curves connected, parallel, tangent, etc. These relations are not present in the model, but they can be found when probing the existing curves because the curves are connected, parallel or tangent. Disclosed embodiments find relationships that do not exist explicitly and enforce them.

In some systems, a user may attempt to modify curves but the existing geometric and dimensional constraints get in his way. In many cases, the user is really trying to do a modification that would contradict existing explicit constraints. Disclosed embodiments allow functions to overrule the existing relations. After the modification, the post processing will revive as many geometric and dimensional constraints as possible.

Disclosed embodiments can find relationships between curves and neighboring curves and can use a variational solver to infer and maintain transient constraints for the duration of the operation. Disclosed embodiments can use a scope to limit the search area for relationships. The scope can be small, such as limited to an area close to the selected objects, or large, such as everything that is displayed or loaded.

Disclosed embodiments allow the user to have control over which of the found or inferred relationships are enforced. Disclosed embodiments can post-processes the results and attempt to revive pre-existing explicit constraints.

FIG. 2 illustrates a flowchart of a process in accordance with disclosed embodiments that may be performed, for example, by one or more PLM or PDM systems (referred to generically as "the system"), and other figures are used to illustrate operations on a model as described herein.

The system receives a geometric model having a plurality of curves (205). "Receiving," as used herein, can include loading from storage, receiving from another device or process, receiving via an interaction with a user. The curves may be in a 3D environment or they may be in a 2D environment; this exemplary process is described in the context of a 2D environment.

The system receives a selection of one or more of the plurality of curves (210). This can be, for example, a user selection through a user interface of the system. As part of this process, the system can determine the user's selection intent.

The system finds curves of the geometric model that are related to the selected curves and the corresponding relationships (215). During this process, the system finds curves that are related to the selected curves by defined relationships. It can find relationships such as tangent, parallel, collinear, concentric, equal radius, symmetry, and others. The curve recognition can also identify fillet-like arcs and maintain the fillet relationships with a constant fillet radius.

These relationships can be maintained while the function operates so the chosen relationships will also be true for the output. The curves and relationships that are found in the curve recognition process are added to a selected curves set that includes the user-selected curves as well as the system-found curves and relationships. This selected curve set can be used in other processes.

There may also be relationships that are hidden from the user, such as coincident and tangency relations. These relationships are found based on the tolerances of the curves that are in the selection. The threshold tolerances that are used for this can be defined by the user. The user can choose to work with larger tolerances to allow working and fixing bad curve networks in imported geometry. Maintaining these coincident and tangency relationships is not optional in most embodiments.

The curve recognition process can be performed within a defined scope. For some relations in the curve recognition a scope is not needed. The scope can be determined by the selection itself Tangent will only find curves tangent to the selected curves, which limits itself Concentric will only look for arcs and circles that are concentric to selected arc or circle, there is no risk of this getting out of hand.

However, constraints such as parallel, collinear, equal radius, and symmetry could lead to long search times when the sketch contains many curves. For the following relations, the scope is definitively preferred when there are many curves: parallel, collinear, equal radius, and symmetry, Perpendicular, Horizontal, Vertical and Equal Length.

The Near scope is defined to include the curves in the same loop or intersecting loops or adjacent loops of the selected curves only as relational curves. A loop is an adjacent loop if there is no other curve between the loop of the selected curve and this loop.

For example, for two parallel lines, find the overlapping portion along the perpendicular direction. If no overlap portion, the two lines are not adjacent. From the midpoints of the overlap portion, the system can draw a line. If the line does not intersect with other curve, the two parallel lines are adjacent.

For two collinear lines, if they have overlap portion, they are adjacent. Otherwise, the system can draw a line between their closest ends. If the line does not intersect with the other loop, the two collinear lines are adjacent.

For two equal radius circles/arcs, if they intersect, they are adjacent. Otherwise, the system can draw the minimum distance line between them. If the line does not intersect with the other loop, the two circles/arcs are adjacent.

Additionally, there will be neighboring curves that are connected to the ends of the curve collection.

In various embodiments, curves selected by the user will typically consist of one or more open or closed loops. At the end of the open loops there might be connected curves. These curves are the neighboring curves. The coincident relations between the neighboring curves and the selection can be found and maintained. Coincident relations between the neighboring curves and the rest of the sketch can also be implicitly maintained. These connected curves that are beyond the neighboring curves do not even have to be within the scope. These curves will not typically be modified.

Figure 3A:
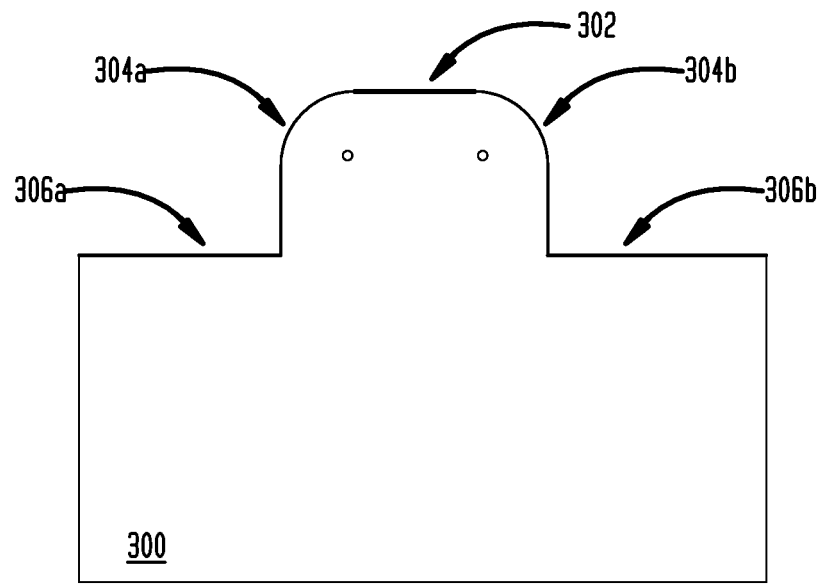
FIGS. 3A and 3B illustrate an exemplary 2D geometric model before and after a modification in accordance with disclosed embodiments.
Figure 3B:
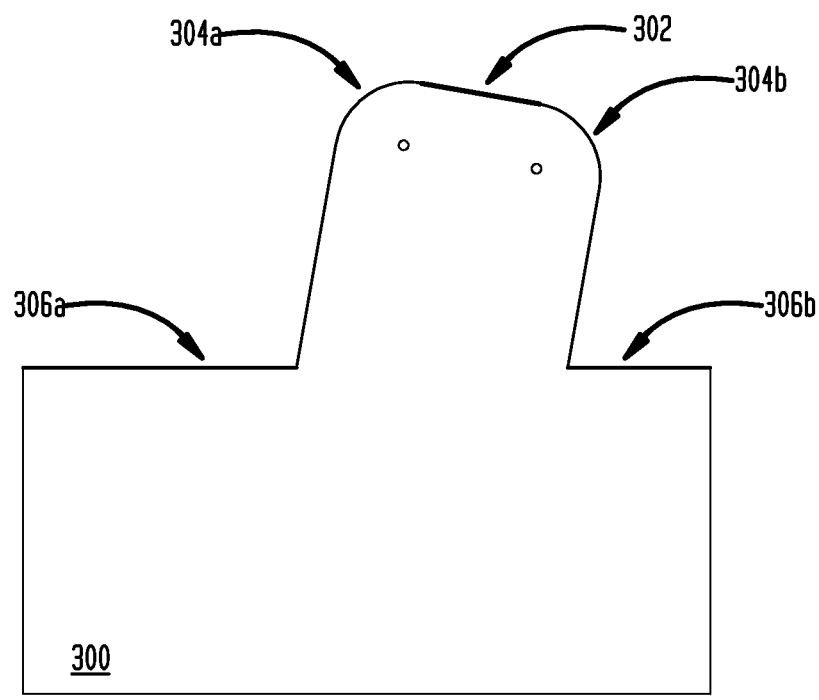

FIGS. 3A and 3B illustrate an exemplary 2D geometric model 300 before and after a modification, respectively. In this example, the system received, from a user, a selection of the curve 302 as illustrated in FIG. 3A. The system finds, using a curve recognition process, that curves 304a and 304b are connected to curve 302 and the ends of curves 304a and 304b are collinear to curve 302. The system finds, using the curve recognition process, that curves 306a and 306b are neighboring connected curves to curves 304a and 304b, respectively. All of these curves and their relationships can be added to the selected curve set.

The system receives a user modification/edit of the model to move curve 302, as illustrated in FIG. 3B. The modification moved the curve 302 and curves 304a/304b and maintains connections between the curves 304a/304b and the neighboring curves 306a/306b. The remaining curves are not modified. They remain fixed even though they may have been inside the initial selection scope.

Returning to FIG. 2, the system can pre-process the selected curve set (220), including the curves and relationships. The curves that have been selected or identified by the curve finder might have geometric and dimensional constraints applied to them. The curve modification operation will be allowed to override these constraints and dimensions, but at the same time tries to maintain as much of the design intent as it can.

This pre-process can include de-activating the model's constraint system (or the model's set of constraints) until after the modification (below) has been defined. Now the selected curves can be moved with only the restrictions imposed by the curve recognition relationships.

The system receives a modification of the selected curves (225). This can be, for example, an interaction where the user "drags" the selected curve through the user interface to a new location, or can be other modifications of the selected curves known to those of skill in the art, such as a move, rotate, move/rotate, offset move, change size, or even a delete operation. The user provides the modification input using a user interface that is suitable for the chosen modification type.

The system performs the modification (230) according to the selected curve set, to produce a modified geometric model and a modified selected curve set. This is typically a variational solve including the selected curves modified as defined by the user, along with the other curves and relationships of the selected curve set. The modification is handled by the solving process. In various embodiments, the modification is local and does not involve the model's constraint system even if the operation takes place in a constrained sketch feature.

The modified geometric model can be displayed using a dynamic preview of the output result; the user can change the modification while looking at the dynamic preview (in which case the process can repeat to receiving the modification).

The system can post-process the modified selected curve set (235), including the curves and relationships. When the modification operation is performed on pre-constrained curves then constraint post processing should be performed. After the modification, the constraint solver knows where the curves will be according to the modified geometric model or modified selected curve set. The system can re-activate the model's constraint system and work down the list of preprocessed constraints and attempt to unsuppress and apply as many constraints and dimensions as possible without compromising the output result.

For constraints that are related to the modified selected curve set, the system will check if the new position is compatible with the constraint. If the new position is compatible, then the system will reapply the constraint. If the new position and the constraint are not compatible, then the constraint is deleted.

If curves that are used in a constraint or dimension are no longer present in the modified geometric model, as result of the modification, then this constraint or dimension is deleted. If unsuppressing the constraint would conflict with the modified geometric model, then these sketch constraints and dimensions will be deleted. In this situation, the values of dimensional constraints may be changed in order to satisfy the solution.

There are certain constraints that can be maintained by adjusting them after an edit. For example, a fixed constraint may not have an associated coordinate, so it can be preserved, and after editing and moving the related curve, the new fixed position will be the new location. As another example, a constant length constraint may not have an associated expression, so it can be preserved, and after editing the hard-coded length is adjusted to the new length. From this point on, the new length of the line will be the constant length for subsequent solve. A constant angle constraint can be maintained in a similar way. Uniform and non-uniform scale constraints, defining whether a model can be scaled uniformly on all axes or a specific axis, can be maintained.

When possible, the system will maintain any driving dimensional constraints. When the value has changed then the system will do the following:

The expression is a value/formula and it is unused elsewhere in the geometric model. In this case, the system can edit the expression to match the new value and can notify the user that the expression of a driving dimension was adjusted to match the new value. Any formula used in the expression is now lost.

The expression is a value/formula, but is used by another expression in the geometric model. In this case, the system can make the dimension as of-reference and can notify the user that a dimension was made of-reference to prevent other curves from moving. A user can make the dimension active to restore the relationship.

The system stores or displays the modified geometric model (240), including the modified selected curve set and including any re-activated and applied constraints. The curves in the modified selected curve set are already part of the modified geometric model; the found relationships and other date of the modified selected curve set are no longer needed so they can be deleted or maintained in various embodiments. The system can store the modified selected curve set for further processing of the same selected curves to save repeating the process of finding related curves. If any of the curves were used downstream as input to another feature, then this relationship must be maintained. Display properties can be unchanged.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC § 112 unless the exact words "means for" are followed by a participle.

What is claimed is:

1. A method for modifying a geometric model, the method performed by a data processing system and comprising:
    receiving a geometric model by the data processing system, the geometric model including a plurality of curves;
    receiving, by the data processing system, a selection of a curve of the plurality of curves;
    finding at least one other curve of the plurality of curves, by the data processing system, that is related to the selected curve and finding relationships between the selected curve and the at least one other curve, including adding the selected curve, the at least one other curve, and the relationships to a selected curve set;

pre-processing, by the data processing system, the selected curve set, including de-activating a set of constraints for the geometric model;

receiving a modification of the selected curve, by the data processing system, and modifying the selected curve set, to produce a modified geometric model and modified selected curve set;

post-processing the modified selected curve set, by the data processing system, by checking each of the set of constraints to determine if each constraint is consistent with the modification of the selected curve, and re-activating and applying only the constraints in the set of constraints that are consistent with the modification of the selected curve; and displaying and storing the modified geometric model.

2. The method of claim 1, wherein the relationships include one or more of tangent, parallel, collinear, concentric, equal radius, or symmetry.

3. The method of claim 1, wherein the modification is one or more of move, rotate, offset, change size, or delete operation.

4. The method of claim 1, wherein finding at least one other curve is performed using a defined scope.

5. The method of claim 1, wherein re-activating and applying constraints for the geometric model includes changing dimensional constraints that conflict with the modification.

6. The method of claim 1, wherein the geometric model is a two-dimensional model.

7. A data processing system comprising: a processor; and an accessible memory, the data processing system particularly configured to receive a geometric model, the geometric model including a plurality of curves receive a selection of a curve of the plurality of curves;

find at least one other curve of the plurality of curves that is related to the selected curve and finding relationships between the selected curve and the at least one other curve, including adding the selected curve, the at least one other curve, and the relationships to a selected curve set;

pre-process the selected curve set, including de-activating a set of constraints for the geometric model;

receive a modification of the selected curve and modify the selected curve set, to produce a modified geometric model and modified selected curve set;

post-process the modified selected curve set by checking each of the set of constraints to determine if each constraint is consistent with the modification of the selected curve, and i re-activating and applying only the constraints in the set of constraints that are consistent with the modification of the selected curve; and display and store the modified geometric model.

8. The data processing system of claim 7, wherein the relationships include one or more of tangent, parallel, collinear, concentric, equal radius, or symmetry.

9. The data processing system of claim 7, wherein the modification is one or more of move, rotate, offset, change size, or delete operation.

10. The data processing system of claim 7, wherein finding at least one other curve is performed using a defined scope.

11. The data processing system of claim 7, wherein re-activating and applying constraints for the geometric model includes changing dimensional constraints that conflict with the modification.

12. The data processing system of claim 7, wherein the geometric model is a two-dimensional model.

13. A non-transitory computer-readable medium encoded with executable instructions that, when executed, cause one or more data processing systems to:

receive a geometric model, the geometric model including a plurality of curves receive a selection of a curve of the plurality of curves;

find at least one other curve of the plurality of curves that is related to the selected curve and finding relationships between the selected curve and the at least one other curve, including adding the selected curve, the at least one other curve, and the relationships to a selected curve set;

pre-process the selected curve set, including de-activating a set of constraints for the geometric model;

receive a modification of the selected curve and modify the selected curve set, to produce a modified geometric model and modified selected curve set;

post-process the modified selected curve set by checking each of the set of constraints to determine if each constraint is consistent with the modification of the selected curve, and re-activating and applying only the constraints in the set of constraints that are consistent with the modification of the selected curve; and display and store the modified geometric model.

14. The computer-readable medium of claim 13, wherein the relationships include one or more of tangent, parallel, collinear, concentric, equal radius, or symmetry.

15. The computer-readable medium of claim 13, wherein the modification is one or more of move, rotate, offset, change size, or delete operation.

16. The computer-readable medium of claim 13, wherein finding at least one other curve is performed using a defined scope.

17. The computer-readable medium of claim 13, wherein re-activating and applying constraints for the geometric model includes changing dimensional constraints that conflict with the modification.

* * * * *